United States Patent
Koch et al.

(10) Patent No.: US 9,184,582 B2
(45) Date of Patent: Nov. 10, 2015

(54) FAIL OPERATIONAL POWER SYSTEM WITH SINGLE ENERGY STORAGE

(71) Applicant: GM GLOBAL TECHNOLOGY OPERATIONS LLC, Detroit, MI (US)

(72) Inventors: David P. Koch, Bloomfield Hills, MI (US); Chandra S. Namuduri, Troy, MI (US); Jeffrey James Hoorn, Northville, MI (US); Nikhil L. Hoskeri, Ann Arbor, MI (US); Mark S. Hoinka, Southfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 119 days.

(21) Appl. No.: 14/017,067

(22) Filed: Sep. 3, 2013

(65) Prior Publication Data

US 2014/0078630 A1    Mar. 20, 2014

Related U.S. Application Data

(60) Provisional application No. 61/703,304, filed on Sep. 20, 2012.

(51) Int. Cl.

| | |
|---|---|
| *H02H 3/20* | (2006.01) |
| *B60W 50/02* | (2012.01) |
| *G01R 19/00* | (2006.01) |
| *G01R 19/165* | (2006.01) |
| *G01R 31/00* | (2006.01) |
| *B60L 3/00* | (2006.01) |
| *B60L 3/04* | (2006.01) |
| *B60L 11/00* | (2006.01) |
| *B60L 11/18* | (2006.01) |

(52) U.S. Cl.
CPC ............... *H02H 3/20* (2013.01); *B60L 3/0046* (2013.01); *B60L 3/0069* (2013.01); *B60L 3/04* (2013.01); *B60L 11/005* (2013.01); *B60L 11/1862* (2013.01); *B60W 50/02* (2013.01); *G01R 19/00* (2013.01); *G01R 19/165* (2013.01); *G01R 31/00* (2013.01); *B60L 2210/10* (2013.01); *B60L 2240/547* (2013.01)

(58) Field of Classification Search
CPC ............ B60W 50/02; B60L 3/00; H02H 3/20
USPC .............................................. 361/86; 307/115
See application file for complete search history.

(56) References Cited

U.S. PATENT DOCUMENTS

| | | | | |
|---|---|---|---|---|
| 6,664,768 | B2 * | 12/2003 | Naidu et al. | 322/29 |
| 8,049,372 | B2 * | 11/2011 | Newhouse et al. | 307/115 |
| 2010/0000804 | A1 * | 1/2010 | Yeh | 180/2.2 |

* cited by examiner

*Primary Examiner* — Thienvu Tran
*Assistant Examiner* — Tien Mai

(57) ABSTRACT

Method for operating a fail operational power system for a vehicle includes monitoring a first voltage on a first power distribution path and a second voltage on a second power distribution path. An isolator switch controllably operative between open and closed states is monitored. The closed state connects the first and second power distribution paths and the open state opens the connection between the first and second power distribution paths. Each of the monitored first and second voltages is compared to a reference voltage. When a predetermined operating mode requiring fail operational power is enabled, the isolator switch is controlled to the open state when at least one of the monitored first and second voltages violates the reference voltage and the isolator switch is controlled to the closed state when neither one of the monitored first and second voltages violates the reference voltage.

17 Claims, 5 Drawing Sheets

FAIL OPERATIONAL POWER SYSTEM WITH SINGLE ENERGY STORAGE

CROSS REFERENCE TO RELATED APPLICATIONS

This application claims the benefit of U.S. Provisional Application No. 60/703,304, filed on Sep. 20, 2012, which is incorporated herein by reference.

TECHNICAL FIELD

This disclosure is related to providing electrical power to critical electrical loads during electrical faults when a fail operational system is enabled.

BACKGROUND

The statements in this section merely provide background information related to the present disclosure. Accordingly, such statements are not intended to constitute an admission of prior art.

Autonomous driving systems and freeway limited-ability autonomous driving (FLAAD) systems utilize inputs regarding the road, environment, and other driving conditions to automatically control throttle, braking and steering mechanisms. Accurate estimation and identification of a clear path over which to operate a motor vehicle is desirable in replacing the human mind as a control mechanism for vehicle operation.

In any autonomous driving system, it is desirable that critical electrical loads for providing operation of the vehicle when autonomous driving is enabled are supplied uninterrupted power for a period of time, e.g., 5 seconds, during faults in any one of the electrical power sources or power distribution paths so that appropriate controllers associated with the critical electrical loads continue to function during the period of time.

The critical electrical loads can include fail operation system (FOS) loads powering controllers for operating various actuators and systems required for autonomous driving, e.g., when a FLAAD mode is enabled. It is desirable that the FOS loads be fail operational and receive a redundant power supply even during electrical faults in the electrical system for at least 5 seconds. When FLAAD mode is enabled, a continuous fault diagnosis is monitored to detect the existence of any faults in the electrical system. When a fault is detected during autonomous driving, i.e., when the FLAAD mode is enabled, the vehicle is configured to temporarily switch to lane centering and requires an immediate driver take-over. Accordingly, the vehicle must maintain lateral/longitudinal for at least a predetermined period of time, e.g., 5 seconds, during the driver take-over.

It is known, for example, to provide back-up power using additional batteries or ultra-capacitors for each FOS load when a loss of power is detected. Additional batteries or ultra-capacitors add mass and increased package size for each FOS load; increase cost if sized to support each FOS load individually; and do not support the entire electrical system or controllers of the vehicle, but only supports those FOS loads to which the additional batteries or ultra-capacitors are assigned.

SUMMARY

Method for operating a fail operational power system for a vehicle includes monitoring a first voltage on a first power distribution path and a second voltage on a second power distribution path. An isolator switch controllably operative between open and closed states is monitored. The closed state connects the first and second power distribution paths and the open state opens the connection between the first and second power distribution paths. Each of the monitored first and second voltages is compared to a reference voltage. When a predetermined operating mode requiring fail operational power is enabled, the isolator switch is controlled to the open state when at least one of the monitored first and second voltages violates the reference voltage and the isolator switch is controlled to the closed state when neither one of the monitored first and second voltages violates the reference voltage.

BRIEF DESCRIPTION OF THE DRAWINGS

One or more embodiments will now be described, by way of example, with reference to the accompanying drawings, in which.

DETAILED DESCRIPTION

Figure 1:
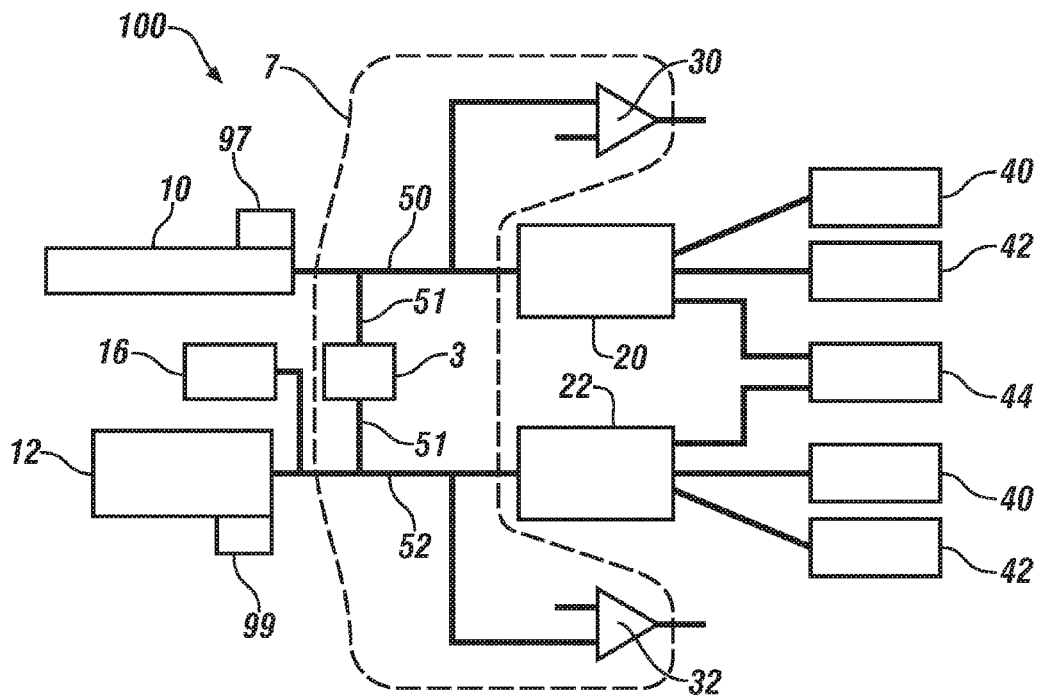
FIG. 1 illustrates an exemplary fail operational power system (FOPS) including two parallel power distribution paths each powered by an independent electrical source for supplying electrical power to critical loads partitioned on the two parallel power distribution paths, in accordance with the present disclosure.

Referring now to the drawings, wherein the showings are for the purpose of illustrating certain exemplary embodiments only and not for the purpose of limiting the same, FIG. 1 illustrates an exemplary fail operational power system (FOPS) 100 including two parallel power distribution paths each powered by an independent power source for supplying electrical power to critical loads partitioned on the two parallel power distribution paths in accordance with the present disclosure. The FOPS 100 includes a first independent power source 10 and a second independent power source 12. The term "independent power source" can refer to a power source having the ability to independently source power during an abnormal condition such as an electrical fault within the FOPS. The first independent power source 10 includes an electrical generator or a DC-DC converter as commonly employed in hybrid electric vehicles (HEVs), and is electrically coupled to a first electrical center 20 via the first power distribution path 50. The second independent power source 12 includes an energy storage device (ESD), e.g., either a 12V battery or ultra-capacitors both with an optional DC-DC converter. Thus, the FOPS 100 includes a single ESD. The second independent power source 12 is electrically coupled to a second electrical center 22 via the second power distribution path 52. In one embodiment, a starter 16 can be powered by the second independent power source 12 that includes a 12V battery. It will be appreciated that the second independent power source 12 is dependent upon power from the first independent power 10 source to maintain a sufficient state of charge during normal conditions.

The FOPS further includes first and second voltage detectors 30, 32, respectively. When a predetermined operating mode requiring fail operational power is enabled, each of the first and second voltage detectors 30, 32, respectively, can be configured to detect an abnormal condition such as an electrical fault in either of the first and second independent power sources 10, 12, respectively, and/or the first and second parallel power distribution paths 50, 52, respectively. As used herein, the term "predetermined operating mode requiring fail operational power" refers to any operating mode of the vehicle that must maintain operation in the presence of a power fault or failure, such as the detection of the abnormal condition discussed herein. It will be understood that usage of the term "predetermined operating mode" infers that fail operational power is required. The predetermined operating mode can include, but is not limited to, an autonomous driving mode, a semi-autonomous operating mode and a freeway limited-ability autonomous driving (FLAAD) mode. As used herein, the term "FLAAD mode" can refer to operation of the vehicle in one of the semi-autonomous driving mode and the autonomous driving mode on a freeway. The first voltage detector 30 can detect the abnormal condition on the first power distribution path 50 during the predetermined operating mode. For instance, the first voltage detector 30 monitors a first voltage on the first power distribution path 50, and compares the monitored first voltage to a reference voltage. If the monitored first voltage violates the reference voltage, the abnormal condition (e.g., an electrical fault) can be detected. The second voltage detector 32 can detect the abnormal condition on the second power distribution path 52 during the predetermined operating mode. For instance, the second voltage detector 32 monitors a second voltage on the second power distribution path 52, and compares the monitored second voltage to the reference voltage. If the monitored second voltage violates the reference voltage, the abnormal condition can be detected. In one embodiment, the reference voltage can include a first voltage range when an isolator switch 3 is operative in a closed state. In a non-limiting example, the first voltage range can have a first lower limit of 10 V and a first upper limit of 16 V. In another embodiment, the reference voltage can include a second voltage range when the isolator switch 3 is in operative in an open state, i.e., subsequent to detection of the abnormal condition. In a non-limiting example, the second voltage range can have a second lower limit of 10.5 V and a second upper limit of 15.5 V. Thus, the second lower limit is greater than the first upper limit and the second upper limit is less than the first upper limit. In other words, the second voltage range is within the first voltage range.

Each of a plurality of fail operational system (FOS) loads 40, 42, 44 are partitioned on the first and second power distribution paths 50, 52, respectively. While the FOPS 100 of FIG. 1 illustrates first, second and third FOS loads 40, 42, 44, the FOPS 100 can include any number of FOS loads and is not limited to three FOS loads. FOS loads can include, but are not limited to display modules, brake modules and camera modules for object detection and clear path determination. Simply put, the FOS loads power controllers for operating various actuators and systems required for autonomous driving, e.g., when a FLAAD mode is enabled. Under normal conditions, the first electrical center 20 is configured to distribute half the required load to each of the FOS loads 40, 42, 44 from the first independent power source 10 via the first power distribution path 50. Likewise, the second electrical center 22 is configured to distribute the other half of the required load to each of the FOS loads 40, 42, 44 from the second independent power source 12 via the second power distribution path 52. As used herein, the term "normal conditions" refers to conditions when the predetermined driving mode, e.g., FLAAD mode, is not enabled or the abnormal condition is not detected when the predetermined driving mode is enabled. Under such "normal conditions," the isolator switch 3 is always closed, i.e., the isolator switch 3 is always operative in a closed state. In an exemplary embodiment, the predetermined operating mode including the FLAAD mode is only enabled when both independent power sources 10 and 12 are initially verified to be in a good state of health (SOH). In one embodiment, the good state of health can include the state of health having at least a 90% state-of-charge (SOC). For instance, the SOC of the second independent power source 12 can be monitored and compared to a SOC threshold, wherein the FLAAD mode is permitted to be enabled only if the monitored SOC of the second power source 12, is at least the SOC threshold. In a non-limiting example, the SOC threshold is 90%. It will be appreciated that the independent power sources 10 and 12 may each include a respective sensor 97 and 99, respectively, to monitor the SOH. The FOS loads 40, 42, 44 are designed not to reset for a predetermined time (e.g., 100 microseconds) during periods when the reference is violated.

Figure 5:
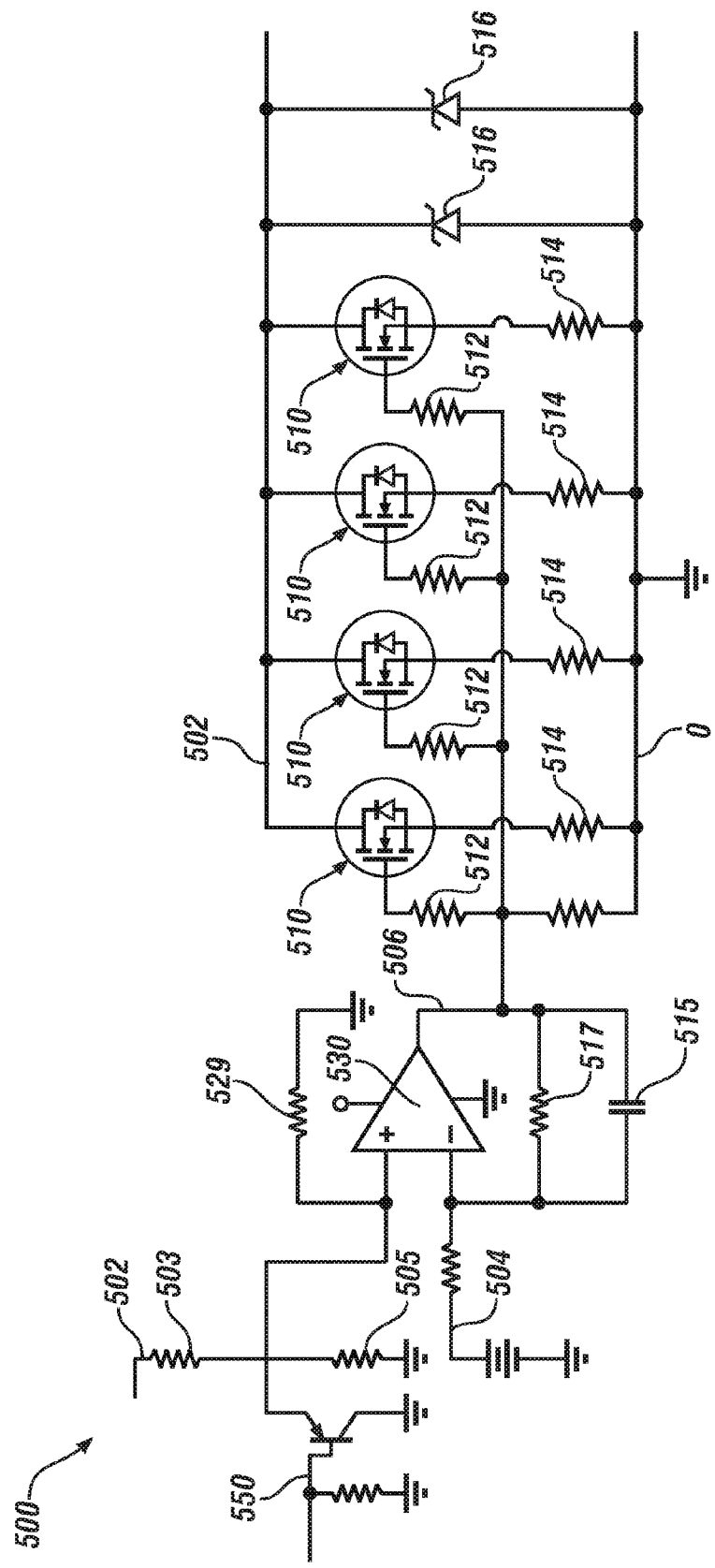
FIG. 5 illustrates a schematic of an exemplary voltage clamp circuit with reference to voltage clamp circuits 460 and 462 of FIG. 4, in accordance with the present disclosure.

The isolator switch 3 is configured to connect the power distribution paths 50 and 52 via connector path 51 when the isolator switch 3 is in the closed state. The isolator switch 3 is operative in the closed state under the under normal conditions with voltage drops less than a predetermined value. In a non-limiting example, the predetermined value is 100 mV. When the abnormal condition is detected in the predetermined operating mode by at least one of the first and second voltage detectors 30, 32, respectively, a control signal forces the isolator switch 3 to operate in an open state opening the connection between the power distribution paths 50 and 52. It will be appreciated that the connection between the power distribution paths 50 and 52 is open when the isolator switch 3 is in the open state. Accordingly, operating the isolator switch 3 in the open state opens the connection between the first and second power distribution paths 50, 52, respectively, to enable the required power to be supplied to the FOS loads 40, 42, 44 in the presence of the abnormal condition for at least a fail operational time, e.g., 5 seconds, to provide operation in the predetermined operating mode until the vehicle operator takes-over control of the vehicle. An isolator switch controller 200 that evaluates specific operating conditions of the vehicle to generate the control signal to control the isolator switch 3 between open and closed states is discussed in greater detail below with reference to FIG. 2. In an exemplary embodiment, the isolator switch 3 has a steady state maximum load of 160 A and a transient load maximum of 200 A. The isolator switch 3 further includes a voltage clamp circuit on each load side of the isolator switch 3 for maintaining the voltage within a predetermined range when a predetermined operating mode, e.g., FLAAD mode, is active and enabled. An exemplary voltage clamp circuit is described with reference to FIG. 5.

Operation of the vehicle can further dictate the operation of the isolator switch 3 between open and closed states. The isolator switch 3 is ON when in the closed state and the isolator switch 3 is OFF when in the open state. During a Key On event without autostart the isolator switch is ON. During a Key On event with autostart cranking the isolator switch is ON. During a Key Off event, the isolator switch 3 is ON. When the predetermined operating mode that includes the FLAAD mode is active and enabled, the isolator switch 3 is ON unless the abnormal condition, e.g., an electrical fault, is detected. When the predetermined operating mode is inactive and disabled, the isolator switch 3 is ON. In one embodiment, when the predetermined operating mode is active, an active high signal is indicated.

A FOPS module 7 can be included, having supervisory control over the first voltage detector 30, the second voltage detector 32 and the isolator switch 3. Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any controller executable instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 microseconds during ongoing engine and vehicle operation. Alternatively, routines may be executed in response to occurrence of an event.

Figure 2:
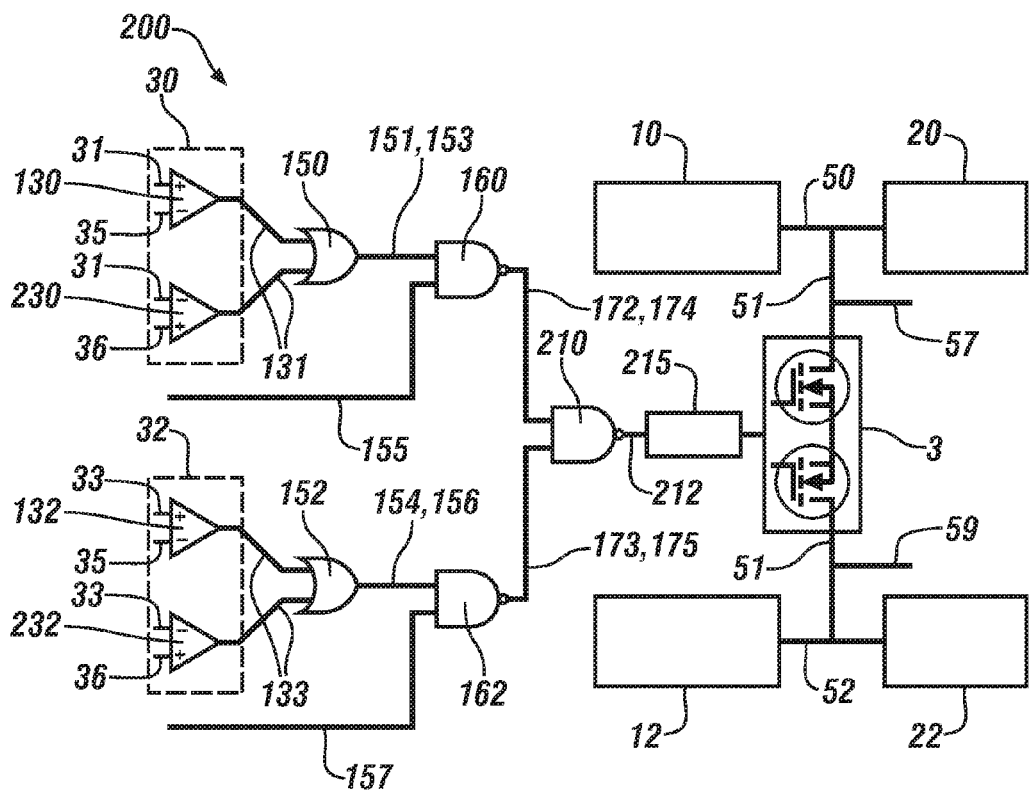
FIG. 2 illustrates an isolator switch controller that evaluates specific operating conditions of the vehicle to generate a control signal to control an isolator switch 3 of FIG. 1 between open and closed states, in accordance with the present disclosure.

FIG. 2 illustrates the isolator switch controller 200 that evaluates specific operating conditions of the vehicle to generate the control signal to control the isolator switch 3 of FIG. 1 between open and closed states, in accordance with the present disclosure. The isolator switch controller 200 can be implemented within the FOPS module 7 of FIG. 1. As aforementioned, when the predetermined operating mode is enabled, each of the first and second voltage detectors 30, 32, respectively, can be configured to detect the abnormal condition when at least one of the respective first and second monitored voltages violate the reference voltage. In an exemplary embodiment, the isolation switch controller 200 of FIG. 2 includes the reference voltage as one of the aforementioned first and second voltage ranges. For simplicity, the first and second voltage ranges will be collectively referred to as "voltage range."

In the illustrated embodiment, the first voltage detector 30 includes a first upper limit voltage detector 130 and a first lower limit voltage detector 230. The first upper limit voltage detector 130 compares the first monitored voltage 31 of the first power distribution path 50 to an upper limit threshold 35. The first lower limit voltage detector 230 compares the first monitored voltage 31 to a lower limit threshold 36. In one embodiment, the upper limit threshold 35 includes the first upper limit of 16 V of the first voltage range. In another embodiment, the upper limit threshold 35 includes the second upper limit of 15.5 V of the second voltage range which the voltage must fall after exceeding 16.0 V to be considered voltage in range. This provides voltage detection hysteresis.

Each of the first upper and lower limit voltage detectors 130, 230, respectively, output a first range condition 131 indicating whether the first monitored voltage 31 is within the upper and lower limit thresholds 35, 36, respectively, or whether the first monitored voltage 31 is greater than the upper limit threshold 35 or less than the lower limit threshold 36. The first range condition 131 is input to a first fault module 150.

The first fault module 150 outputs one of a first fault condition 151 and a first no fault condition 153 into a first condition module 160. The first fault condition 151 is determined if the first range condition 131 indicates the first monitored voltage 31 is outside the upper and lower limit thresholds 35, 36, respectively, i.e., the first monitored voltage 31 of the first power distribution path 50 is out of range. The first no fault condition 153 is determined if the first range condition 131 indicates the first monitored voltage is within the upper and lower limit thresholds 35, 36, respectively. An operating mode input 155 is input to the first condition module 160 for comparison with one of the first fault condition 151 and the first no fault condition 153. The operating mode input 155 indicates whether the predetermined operating mode, e.g., FLAAD mode, is active and enabled, or whether the predetermined operating mode is inactive and disabled.

The first condition module 160 determines one of a first normal condition 172 and a first abnormal condition 174 on the first power distribution path 50. The first normal condition 172 on the first power distribution path 50 is determined whenever the operating mode input 155 indicates the predetermined operating mode is inactive and disabled. The first normal condition 172 is additionally determined whenever the predetermined operating mode is active and enabled and the first no fault condition 153 is detected. The first abnormal condition 174 is detected when the predetermined operating mode is active and enabled and the first fault condition 151 is detected. One of the first normal and abnormal conditions 172, 174, respectively, is input to an isolator condition module 210.

Similarly, the second voltage detector 32 includes a second upper limit voltage detector 132 and a second lower limit voltage detector 232. The second upper limit voltage detector 132 compares the second monitored voltage 33 of the second power distribution path 52 to the upper limit threshold 35. The second lower limit voltage detector 232 compares the second monitored voltage 33 to the lower limit threshold 36.

Each of the second upper and lower limit voltage detectors 132, 232, respectively, output a second range condition 133 indicating whether the second monitored voltage 33 is within the upper and lower limit thresholds 35, 36, respectively, or whether the second monitored voltage 33 is greater than the upper limit threshold 35 or less than the lower limit threshold 36. The second range condition 133 is input to a second fault module 152.

The second fault module 152 outputs one of a second fault condition 154 and a second no fault condition 156 into a second condition module 162. The second fault condition 154 is determined if the second range condition 133 indicates the second monitored voltage 33 is outside the upper and lower limit thresholds 35, 36, respectively, i.e., the second monitored voltage 33 of the second power distribution path 52 is out of range. The second no fault condition 156 is determined if the second range condition 133 indicates the second monitored voltage 33 is within the upper and lower limit thresholds 35, 36, respectively. The operating mode input 155 is input to the second condition module 162 for comparison with one of the second fault condition 154 and the second no fault condition 156.

The second condition module 162 determines one of a second normal condition 173 and a second abnormal condition 175 on the second power distribution path 52. The second normal condition 173 on the second power distribution path 52 is determined whenever the operating mode input 155 indicates the predetermined operating mode is inactive and disabled. The second normal condition 173 is additionally determined whenever the predetermined operating mode is active and enabled and the second no fault condition 156 is detected. The second abnormal condition 175 is detected when the predetermined operating mode is active and enabled and the second fault condition 154 is detected. One of the second normal and abnormal conditions 173, 175, respectively, is input to the isolator condition module 210.

The isolator condition module 210 outputs a control signal 212 that is input to a driver 215. The control signal 212 can include an isolator switch ON request when both the first and second normal conditions 172, 173, respectively, are detected. Accordingly, the driver 215 outputs the isolator switch ON request to the isolator switch 3 to operate the isolator switch 3 in the closed state or to allow the isolator switch 3 to remain operative in the closed state. Likewise, the control signal 212 can include an isolator switch OFF request when at least one of the first and second abnormal conditions 174 and 175, respectively, are detected. Accordingly, the driver 215 outputs the isolator switch OFF request to the isolator switch 3 to operate the isolator switch 3 in the open state or to allow the isolator switch 3 to remain operative in the open state. In an exemplary embodiment, the isolator switch 3 can be OFF, e.g., the open state, during diagnostic testing of the first and second power distribution paths 50, 52, respectively. A first diagnostic input 57 can include a monitored voltage of the first electrical center 20 and a second diagnostic input 59 can include a monitored voltage of the second electrical center 22.

Figure 3:
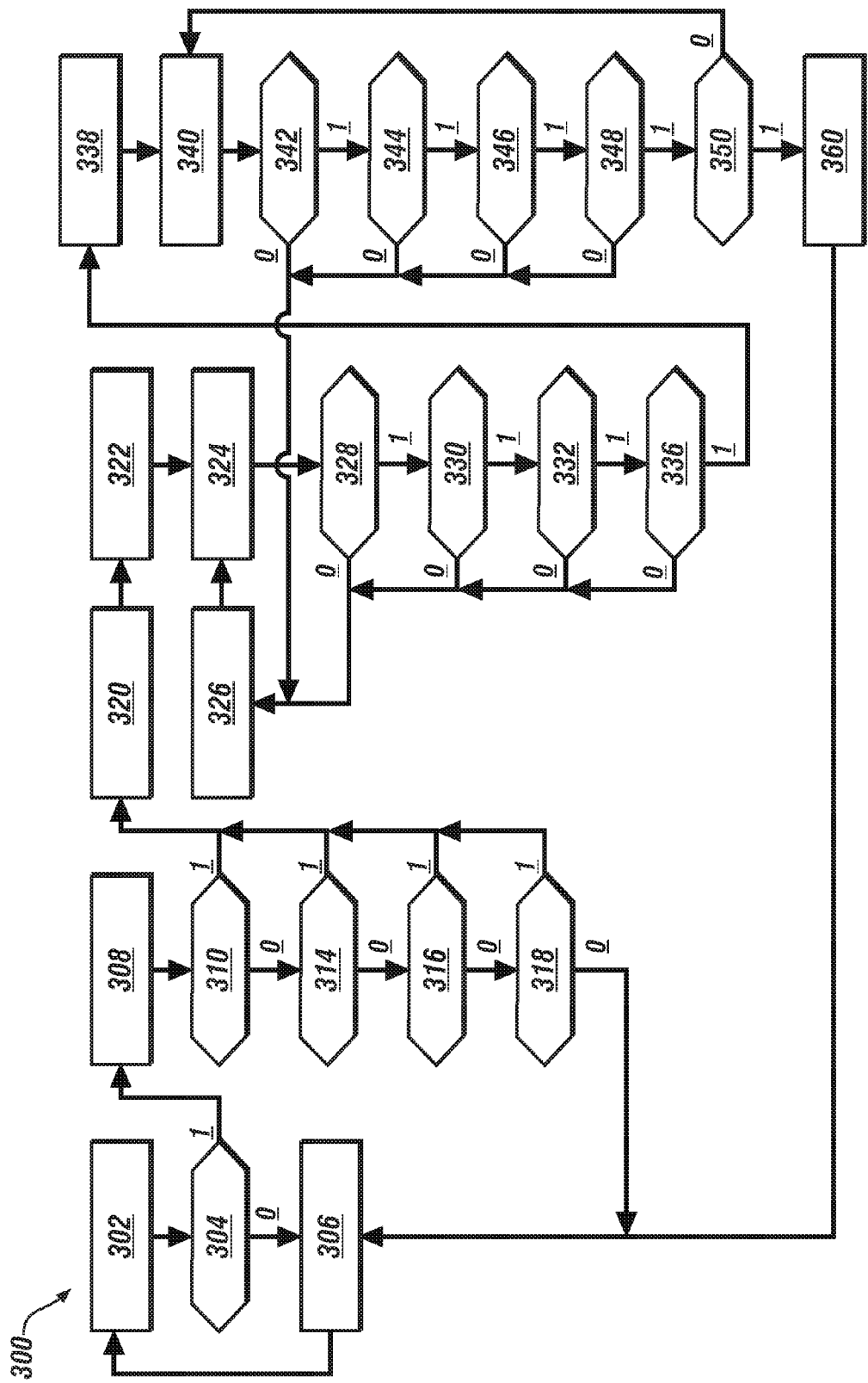
FIG. 3 illustrates an exemplary flowchart 300 for evaluating the FOPS 100 of FIG. 1 to generate the control signal 212 of FIG. 2 for controlling the isolator switch 3 between open and closed states, in accordance with the present disclosure.

FIG. 3 illustrates an exemplary flowchart 300 for evaluating the FOPS 100 of FIG. 1 with reference to the isolator switch controller 200 of FIG. 2 to generate the control signal 212 for controlling the isolator switch 3 between the open and closed states, in accordance with the present disclosure. The exemplary flowchart 300 can be implemented within the FOPS module 7 of FIG. 1. Table 1 is provided as a key to FIG. 3 wherein the numerically labeled blocks and the corresponding functions are set forth as follows.

TABLE 1

| BLOCK | BLOCK CONTENTS |
|---|---|
| 302 | Monitor operating mode. |
| 304 | Is vehicle operating in a predetermined operating mode? |
| 306 | Leave isolator switch 3 closed. |
| 308 | Monitor the first voltage 31 and the second voltage 33. |
| 310 | Is the first monitored voltage 31 greater than the upper limit threshold 35 for a first time period? |
| 314 | Is the first monitored voltage 31 less than the lower limit threshold 36 for the first time period? |
| 316 | Is the second monitored voltage 33 greater than the upper limit threshold 35 for the first time period? |
| 318 | Is the second monitored voltage 33 less than the lower limit threshold 36 for the first time period? |
| 320 | Set flag indicating that at least one of the first and second monitored voltages 31 and 33 is out of range. |
| 322 | Open isolator switch 3. |
| 324 | Monitor the first voltage 31 and the second voltage 33. |
| 326 | Reset a timer for a second time period. |
| 328 | Is the first monitored voltage 31 less than the upper limit threshold 35? |
| 330 | Is the first monitored voltage greater than the lower limit threshold 36? |

TABLE 1-continued

| BLOCK | BLOCK CONTENTS |
|---|---|
| 332 | Is the second monitored voltage less than the upper limit threshold 35? |
| 336 | Is the second monitored voltage greater than the lower limit threshold 36? |
| 338 | Set the timer for the second time period. |
| 340 | Monitor the first voltage 31 and the second voltage 33. |
| 342 | Is the first monitored voltage 31 less than the upper limit threshold? |
| 344 | Is the first monitored voltage greater than the lower limit threshold? |
| 346 | Is the second monitored voltage less than the upper limit threshold 35? |
| 348 | Is the second monitored voltage greater than the lower limit threshold 36? |
| 350 | Has the second time period elapsed? |
| 360 | Reset flag indicating that at least one of the first and second monitored voltages 31 and 33 is out of range. |

At block 302, operating mode status is monitored and the flowchart proceeds to decision block 304. Decision block 304 determines if the vehicle is operating in the predetermined operating mode, i.e., FLAAD mode. A "0" denotes the vehicle is not operating in the predetermined operating mode and the flowchart 300 proceeds to block 306 where the isolator switch 3 is to remain operative in the closed state, i.e., control signal 212 includes the isolator switch ON request. A "1" denotes the vehicle is operating in the predetermined operating mode and the flowchart 300 proceeds to block 308. In one embodiment, the decision of decision block 304 is the operating mode input 155 of FIG. 2.

At block 308, voltages of the first and second electrical centers 20, 22, respectively, are monitored. Monitoring the voltages includes the first voltage 31 of the first power distribution path 50 and the second voltage 33 of the second power distribution path 52.

Decision block 310 determines if the first monitored voltage 31 is greater than the upper limit threshold 35 for a first time period. A "0" denotes the first monitored voltage 31 is not greater than the upper limit threshold 35 for the first time period and the flowchart 300 proceeds to decision block 314. A "1" denotes the first monitored voltage 31 is greater than the upper limit threshold 35 for the first time period and the flowchart 300 proceeds to block 320.

Decision block 314 determines if the first monitored voltage 31 is less than the lower limit threshold 36 for the first time period. A "0" denotes the first monitored voltage 31 is not less than the lower limit threshold 36 for the first time period and the flowchart 300 proceeds to decision block 316. A "1" denotes the first monitored voltage 31 is less than the lower limit threshold 36 for the first time period and the flowchart proceeds to block 320.

Decision block 316 determines if the second monitored voltage 33 is greater than the upper limit threshold 35 for the first time period. A "0" denotes the second monitored voltage 33 is not greater than the upper limit threshold 35 for the first time period and the flowchart 300 proceeds to decision block 318. A "1" denotes the second monitored voltage 33 is greater than the upper limit threshold 35 for the first time period and the flowchart 300 proceeds to block 320.

Decision block 318 determines if the second monitored voltage 33 is less than the lower limit threshold 36 for the first time period. A "0" denotes the second monitored voltage 33 is not less than the lower limit threshold 36 for the first time period and the flowchart 300 proceeds to block 306 where the isolator switch 3 is to remain operative in the closed state, i.e., control signal 212 includes the isolator switch ON request. A "1" denotes the second monitored voltage 33 is less than the lower limit threshold 36 for the first time period and the flowchart proceeds to block 320.

It will be appreciated that in each of decision blocks 310, 314, 316 and 318, the upper limit threshold 35 includes the first upper limit of 16 V and the lower limit threshold 36 includes the first lower limit of 10 V. In an exemplary embodiment, the first time period is 50 microseconds.

At block 320, a flag is set indicating that at least one of the first and second monitored voltages 31, 33, respectively, violates the reference voltage. In other words, at least one of the first and second abnormal conditions 174, 175, respectively, of FIG. 2 is detected. Simply put, the flag indicates that at least one of the first and second monitored voltages 31, 33, respectively, are outside of the first voltage range.

The flowchart 300 proceeds to block 322 where the isolator switch 3 is to be operative in the open state, i.e., control signal 212 includes the isolator switch OFF request. The control signal 212 including the isolator switch OFF request at block 322 controls the isolator switch to transition from operating in the closed state to operating in the open state such that the connection via the connector path 51 between the first and second power distribution paths is opened. In other words, the isolator switch 3 is operative in the open state if at least one of the monitored first and second voltages 31 and 33 is below 10 V, e.g., first lower limit, for greater than 50 microseconds. Likewise, the isolator switch 3 is operative in the open state if at least one of the monitored voltages 31 and 33 is above 16.0 V, e.g., first upper limit, for greater than 50 microseconds.

As will become apparent, the isolator switch 3 remains in the open state until both the monitored first and second voltages 31 and 33 are within the second voltage range. For instance, the isolator switch 3 will remain in the open state if one of the monitored first and second voltages 31 and 33 is below the second lower limit, e.g., 10.5 V. Likewise, the isolator switch 3 will remain in the open state if one of the monitored first and second voltages 31 and 33 is greater than the second upper limit, e.g., 15.5 V.

At block 324, voltages of the first and second electrical centers 20, 22, respectively are monitored. Monitoring the voltages includes the first monitored voltage 31 of the first power distribution path 50 and the second monitored voltage 33 of the second power distribution path 52.

Decision block 328 determines if the first monitored voltage 31 is less than the upper limit threshold 35. A "0" denotes the first monitored voltage 31 is not less than the upper limit threshold 35 and the flowchart 300 proceeds to block 326. A "1" denotes the first monitored voltage 31 is less than the upper limit threshold 35 and the flowchart proceeds to block 330.

Decision block 330 determines if the first monitored voltage 31 is greater than the lower limit threshold 36. A "0" denotes the first monitored voltage 31 is not greater than the lower limit threshold 36 and the flowchart 300 proceeds to block 326. A "1" denotes the first monitored voltage 31 is greater than the lower limit threshold 36 and the flowchart proceeds to block 332.

Decision block 332 determines if the second monitored voltage 33 is less than the upper limit threshold 35. A "0" denotes the second monitored voltage 33 is not less than the upper limit threshold 35 and the flowchart 300 proceeds to block 326. A "1" denotes the second monitored voltage 33 is less than the upper limit threshold 35 and the flowchart proceeds to block 336.

Decision block 336 determines if the second monitored voltage 33 is greater than the lower limit threshold 36. A "0" denotes the second monitored voltage 33 is not greater than the lower limit threshold 36 and the flowchart 300 proceeds to block 326. A "1" denotes the second monitored voltage 33 is greater than the lower limit threshold 36 and the flowchart proceeds to block 338.

It will be appreciated that in each of decision blocks 328, 330, 332 and 336, the upper limit threshold 35 includes the second upper limit of 15.5 V and the lower limit threshold 36 includes the second lower limit of 10.5 V. Accordingly, the isolator switch 3 remains operative in the open state when at least one of the monitored first and second voltages is outside of the second voltage range.

Block 326 resets a timer for a second time period. In a non-limiting embodiment, the second time period is 1 millisecond.

At block 338, the timer is set for the second time period, e.g., 1 millisecond, before proceeding to block 340.

At block 340, voltages of the first and second electrical centers 20, 22, respectively, are monitored. Monitoring the voltages includes the first monitored voltage 31 of the first power distribution path 50 and the second monitored voltage 33 of the second power distribution path 52.

Decision block 342 determines if the first monitored voltage 31 is less than the upper limit threshold 35. A "0" denotes the first monitored voltage 31 is not less than the upper limit threshold 35 and the flowchart 300 proceeds to block 326. A "1" denotes the first monitored voltage 31 is less than the upper limit threshold 35 and the flowchart proceeds to block 344.

Decision block 344 determines if the first monitored voltage 31 is greater than the lower limit threshold 36. A "0" denotes the first monitored voltage 31 is not greater than the lower limit threshold 36 and the flowchart 300 proceeds to block 326. A "1" denotes the first monitored voltage 31 is greater than the lower limit threshold 36 and the flowchart proceeds to block 346.

Decision block 346 determines if the second monitored voltage 33 is less than the upper limit threshold 35. A "0" denotes the second monitored voltage 33 is not less than the upper limit threshold 35 and the flowchart 300 proceeds to block 326. A "1" denotes the second monitored voltage 33 is less than the upper limit threshold 35 and the flowchart proceeds to block 348.

Decision block 348 determines if the second monitored voltage 33 is greater than the lower limit threshold 36. A "0" denotes the second monitored voltage 33 is not greater than the lower limit threshold 36 and the flowchart 300 proceeds to block 326. A "1" denotes the second monitored voltage 33 is greater than the lower limit threshold 36 and the flowchart proceeds to block 350.

It will be appreciated that in each of decision blocks 342, 344, 346, 348, the upper limit threshold 35 includes the second upper limit of 15.5 V and the lower limit threshold 36 includes the second lower limit of 10.5 V.

Decision block 350 determines if the second time period has elapsed. A "0" denotes the second time has not elapsed and the flowchart reverts back to block 340. A "1" denotes the second time period has elapsed and the flowchart 300 proceeds to block 360.

Block 360 resets the flag indicating that the at least one of the first and second monitored voltages 31, 33, respectively, are out of range. Thus, both the first and second monitored voltages 31, 33, respectively are within range. In other words, the first and second normal conditions 172, 173, respectively, of FIG. 2 are detected. The flowchart proceeds to block 306 where the isolator switch 3 is controlled to transition from operating in the open state to operating in the closed state, i.e., control signal 212 includes the isolator switch ON request. In other words, the isolator switch 3 is operative in the closed state when the first and second monitored voltages 31, 33, respectively, are within the second voltage range, e.g., between the second upper limit of 15.5 V and the second lower limit of 10.5 V.

Figure 4:
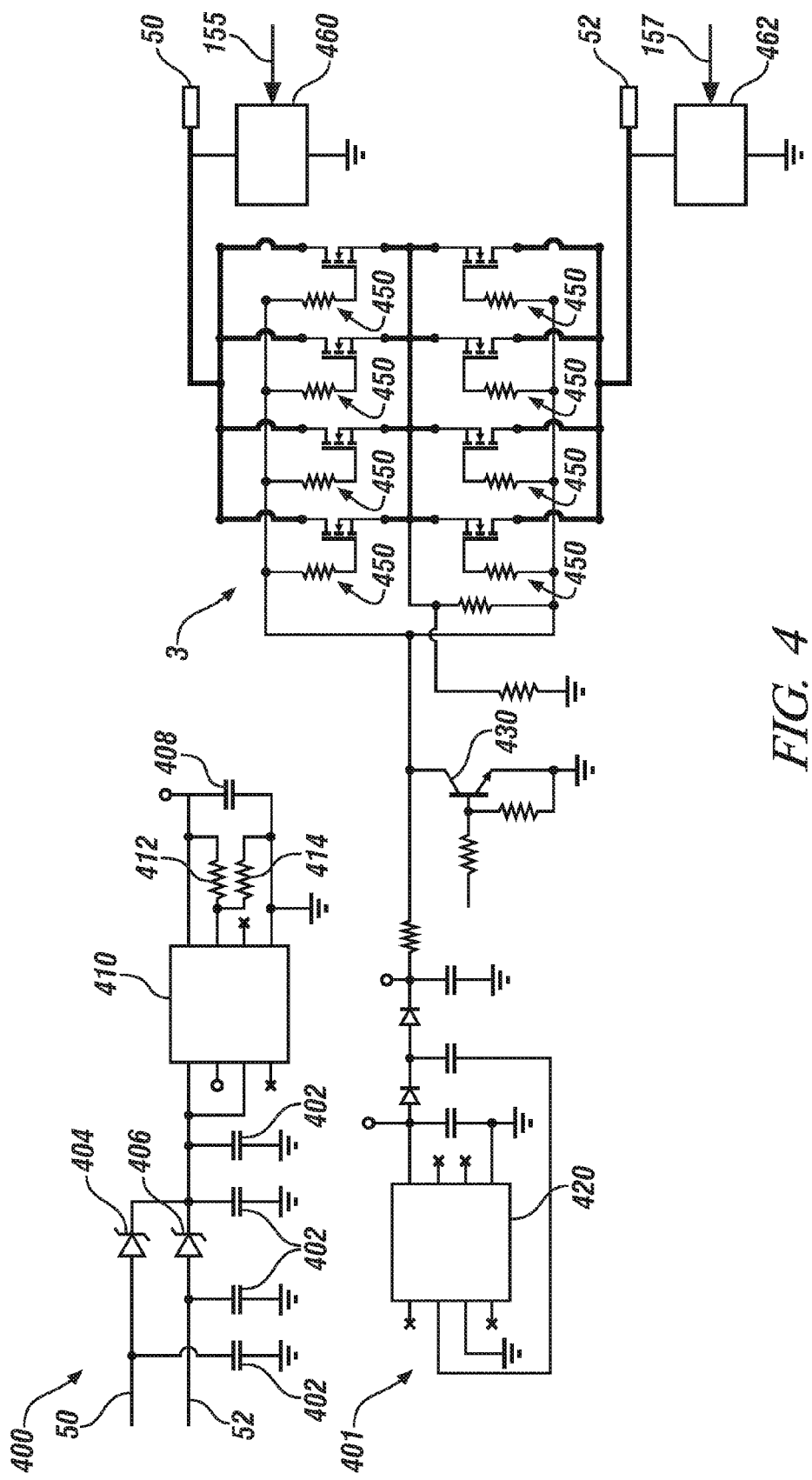
FIG. 4 illustrates a schematic of the isolator switch 3 of FIG. 1 including a power supply circuit and an associated driver circuit, in accordance with the present disclosure.

FIG. 4 illustrates a schematic of the isolator switch 3 of FIG. 1 including a power supply circuit 400 and an associated driver circuit 401, in accordance with the present disclosure. Referring to the power supply circuit 400, the first power distribution path 50 is fed by the first electrical center 20 and the second power distribution path 52 is fed by the second electrical center 22. As aforementioned, the first and second power distribution paths 50, 52, respectively, are arranged in parallel and can be referred to as DC buses. The first power distribution path 50 includes a first diode 404 and the second power distribution path 52 includes a second diode 406. Capacitors 402 can be incorporated between the DC bus terminals and the ground terminal. A voltage regulator chip 410 receives voltage from the first and second power distribution paths 50, 52, respectively. The voltage regulator chip 410 includes eight pins 1-8. The voltage regulator chip provides a regulated voltage to control the operation of the isolator switch 3. The driver circuit 401 responds to abnormal voltage conditions of the paths 50 and 51 requiring the isolator switch 3 to be disabled and in the open state. Feedback resistors 412 and 414 and a feedback capacitor 408 can also be included.

The driver circuit 401 includes a high voltage regulator chip 420, a dissipater transistor 430 and the isolator switch 3. In the illustrated embodiment, the isolator switch 3 is represented schematically as an isolator circuit. Accordingly, the terms "isolator switch" and "isolator circuit" will be used interchangeably in the illustrated embodiment. The isolator circuit 3 includes a single or plurality of metal-oxide-semiconductor field-effect transistors (MOSFETs) 450 connected to in parallel, each having a respective resistor. A source of each MOSFET is connected to a source of a respective parallel MOSFET. A drain of each MOSFET 450 is connected to one of the first and second parallel power distribution paths 50 and 52 of FIG. 1. Each respective resistor of each MOSFET 450 controls a switching speed of the isolator switch 3 by controlling a gate current during opening and closing events of the isolator switch 3.

The high voltage regulator chip 420 is configured to provide a voltage boost to increase the voltage applied to the charge gates of the isolator switch 3 in order to close the isolator switch 3. A dissipater transistor 430 is configured to discharge voltage applied to the charge gates of the isolator switch 3 in order to open the isolator switch 3. The dissipater transistor 430 must be grounded to change the charge applied to the gates of the isolator switch 3 during a transition from closed to open states. In an exemplary embodiment, the terminal of the first parallel power distribution path 50 is electrically coupled to a first voltage clamp device 460 configured to prevent load voltage from exceeding a predetermined value, e.g., 16 V, when the predetermined operating mode, e.g., FLAAD, is active and enabled as determined by the operating mode input 155. Likewise, the terminal of the second parallel distribution path 52 is electrically coupled to a second voltage clamp device 462 configured to prevent load voltage from exceeding a predetermined limit, e.g., 16 V, when the predetermined operating mode, e.g., FLAAD, is active and enabled as determined by the operating mode input 155.

FIG. 4 illustrates a schematic of an exemplary voltage clamp circuit 500 with reference to the voltage clamp circuits 460 and 462 of FIG. 4, in accordance with the present disclosure. As aforementioned, the isolator switch 3 includes a voltage clamp circuit 460 or 462 on a respective load side of the isolator switch 3 for maintaining the voltage below the predetermined limit, e.g., 16 V, during enabled operation in the FLAAD mode, e.g., the predetermined operating mode. The voltage clamp circuit 500 of FIG. 5 can describe either of the first and second voltage clamp circuits 460, 462, respectively, of FIG. 4. The voltage clamp circuit 500 includes at least one MOSFETs 510. In an exemplary embodiment, a plurality of MOSFETs 510 are electrically coupled in parallel across a DC bus 502. Each MOSFET 510 can optionally include a source resistance 512 and a drain resistance 514 to equalize currents.

A differential amplifier 530 compares a voltage of the DC bus 502 to a reference voltage 504. The differential amplifier 530 sets the clamp voltage level through an output 506 of the differential amplifier 530. A potential divider including resistors 503 and 505 is utilized to reduce the DC bus 502 voltage to be comparable with the reference voltage 504 and is connected to the non-inverting input of the differential amplifier 530. Feedback voltage is enabled only when FLAAD mode 550 is active. Gain of the differential amplifier 530 is chosen to minimize a deviation of the DC bus 502 voltage from the reference voltage 504 during voltage clamping. A capacitor 515 across a feedback resistor 517 of the differential amplifier 530 provides stability. Resistor 529 may also be included.

In an exemplary embodiment, the output of the differential amplifier 530 drives the gates of the MOSFETs 510 to operate in a linear region to adsorb enough power to maintain the clamp voltage at a preset value. In an exemplary embodiment, the preset value is 16 V+/−0.25 V. Zener diodes 516 can be optionally included across the DC bus terminals to clamp the voltage during an initial transient to below a maximum rated voltage of the loads, e.g., 40 V, before the MOSFETs 510 are activated to carry the load dump energy.

Figure 6:
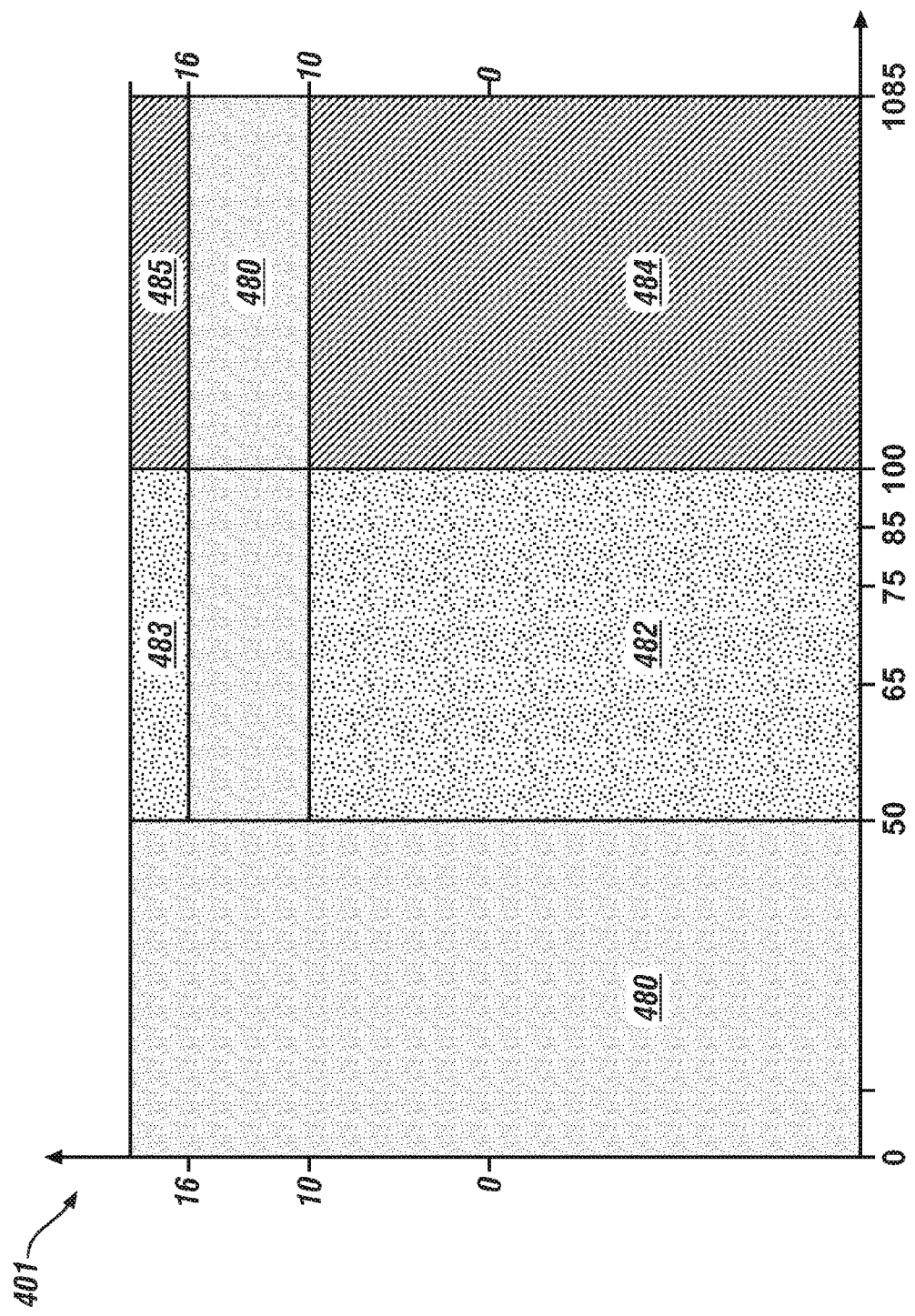
FIG. 6 illustrates an exemplary plot illustrating operation of the FOPS 100 of FIG. 1 when a predetermined operating mode is enabled in response to vehicle system voltage, in accordance with the present disclosure.

FIG. 6 illustrates an exemplary plot 401 illustrating operation of the FOPS 100 of FIG. 1 in response to vehicle system voltage when the predetermined operating mode, e.g., FLAAD, is enabled, in accordance with the present disclosure. Plot 400 will be described with reference to FIGS. 1-3. The vertical y-axis denotes voltage in volts. The horizontal x-axis denotes time in microseconds from 0 to 1,085 microseconds. Dashed vertical lines represent a time at 50 microseconds, 65 microseconds, 75 microseconds, 85 microseconds and 100 microseconds. Area 480 denotes a normal zone defined by the entire voltage range from 0 to 50 microseconds and between 10 V and 16 V from 50 to 1,085 microseconds. Areas 482 and 483 each denote a transition to a fail operational mode zone. Area 482 is defined by all voltages below 10 V from 50 to 100 microseconds. Area 483 is defined by voltages greater than 16 V from 50 to 100 microseconds. Areas 484 and 485 each denote a fail operational mode zone. Area 484 is defined by voltages below 10 V from 100 to 1,085 microseconds. Area 485 is defined by voltages greater than 16 V from 100 to 1,085 microseconds. It will be appreciated that the transition to fail operational mode zone of areas 482 and 483 can include the fail operational mode zone beginning at 85 microseconds.

The normal zone of area 480 includes detection of both the first normal condition 172 and the second normal condition 173 by the isolator controller 200 of FIG. 2. For instance, both the first voltage detector 30 and the second voltage detector 32 detect both the monitored first and second voltages 31, 33, respectively, are within the first voltage range, e.g., less than 16 V and greater than 10 V and the predetermined operating mode is active and enabled. Within the normal zone of area 480, the third isolator switch 3 always remains operative in the closed state.

The transition to fail operational mode zone of areas 482 and 483 includes detection of at least one of the first and second abnormal conditions 174, 175, respectively, by the isolation controller of FIG. 2. For instance, the fail operational mode zone of area 483 occurs when at least one of the first and second voltage detectors 30, 32, respectively, has detected that at least one of the monitored first and second voltages 31, 33, respectively, is greater than the first upper limit, e.g., 16 V, for at least the first time period. Similarly, the fail operational mode zone of area 482 occurs when at least one of the first and second voltage detectors 30, 32, respectively, has detected that at least one of the monitored first and second voltages 31, 33, respectively, is less than the first lower limit, e.g., 10 V, for at least the first time period. In an exemplary embodiment, the first time period is 50 microseconds as illustrated from 0 to 50 microseconds in plot 400.

During the occurrence of the transition to the fail operational mode zone (e.g., areas 482 and 483) when the voltage is out of range, the flag is set at 50 microseconds indicating that at least one of the monitored first and second voltages 31, 33, respectively, are out of range, as determined by block 320 of flowchart 300 of FIG. 3. At 65 microseconds, the second isolator switch 2 begins to transition from operation in the open state to operation in the closed state. As aforementioned, the third isolator switch 3 is not permitted to transition from the closed state to the open state unless the second isolator switch 2 is fully operative in the closed state. At 75 microseconds, the current through the third isolator switch 3 is reduced to zero and the third isolator switch 3 is transitioned to operate in the open state, in response to the isolator switch OFF request by the control signal 212 to the driver 215. It will be appreciated that the transition to the closed state of the second isolator switch 2 must be complete at 75 microseconds. It will be recognized that the period between 65 microseconds and 75 microseconds is indicative of the aforementioned predetermined transitional time, e.g., 10 microseconds. At 85 microseconds, the transition to the open state of the third isolator switch 3 is complete and the connector path 51 illustrated in FIG. 1 is open, i.e., the first and second power distribution paths 50, 52, respectively, are disconnected.

During the occurrence of the transition to the fail operational mode zone when the third isolator switch 3 is fully operational in the open state (e.g., areas 482 and 482 at 85 microseconds), the timer is set at 1 millisecond to determine if both monitored first and second voltages 31, 33, respectively, fall back within the second voltage range, as determined by block 338 of flowchart 300 of FIG. 3. Referring to area 485, at least one of the monitored first and second voltages 31, 33, respectively, is greater than the first upper limit, e.g., 16 V.

At 1,085 microseconds (i.e., 1 millisecond since 85 microseconds), the third isolator switch 3 is transitioned from the operating in the open state to operating in the closed state in response to one of: the monitored first and second voltages 31, 33, respectively, both being less than the second upper limit of 15.5 V for at least the second time period (e.g., 1 millisecond) when at least one of the respective first and second monitored voltages 31, 33, respectively, were previously above the first upper limit of 16 V from 50 to 85 microseconds; and the first and second monitored voltages 31, 33, respectively, both being greater than the second lower limit of 10.5 V for at least the second time period (e.g., 1 millisecond) when at least one of the respective first and second monitored voltages 31, 33, respectively, were previously less than the first lower limit of 10 V from 50 to 85 microseconds.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for operating a fail operational power system for a vehicle, comprising:
monitoring a first voltage on a first power distribution path and a second voltage on a second power distribution path, each power distribution path arranged in parallel and powered by a respective independent power source for supplying electrical power to one or more loads partitioned on each power distribution path;
monitoring an isolator switch controllably operative between open and closed states, said closed state connecting the power distribution paths and said open state opening the connection between the power distribution paths;
comparing each of the monitored first and second voltages to a reference voltage comprising one of:
comparing each of the monitored first and second voltages to a first voltage range only when the isolator switch is operative in the closed state, the first voltage range defined by a first lower limit and a first upper limit; and
comparing each of the monitored first and second voltages to a second voltage range only when the isolator switch is operative in the open state, the second voltage range defined by a second lower limit greater than the first lower limit and a second upper limit less than the first upper limit;
when a predetermined operating mode requiring fail operational power is enabled:
controlling the isolator switch to the open state when at least one of the monitored first and second voltages violates the reference voltage; and
controlling the isolator switch to the closed state when neither one of the monitored first and second voltages violates the reference voltage.

2. The method of claim 1, wherein controlling the isolator switch to the open state when at least one of the monitored first and second voltages violates the reference voltage comprises:
only when the isolator switch is operative in the closed state, controlling the isolator switch to transition from the closed state to the open state when at least one of the monitored first and second voltages is outside of the first voltage range.

3. The method of claim 2, wherein the isolator switch is controlled to transition from the closed state to the open state when at least one of the monitored first and second voltages is outside of the first voltage range for a predetermined duration.

4. The method of claim 1, wherein controlling the isolator switch to the open state when at least one of the monitored first and second voltages violates the reference voltage comprises:
only when the isolator switch is operative in the open state, controlling the isolator switch to remain operative in the open state when at least one of the monitored first and second voltages is outside of the second voltage range.

5. The method of claim 1, wherein controlling the isolator switch to the closed state when neither one of the first and second voltages violates the reference voltage comprises:
  only when the isolator switch is operative in the open state, controlling the isolator switch to transition from the open state to the closed state when both of the monitored first and second voltages are within the second voltage range.

6. The method of claim 5, wherein the isolator switch is controlled to transition from the open state to the closed state when both of the monitored first and second voltages are within the second voltage range for a predetermined duration.

7. The method of claim 1, wherein the isolator switch is always operative in the closed state when the predetermined operating mode is not enabled.

8. The method of claim 1, wherein each power distribution path arranged in parallel and powered by a respective independent power source, comprises:
  the first power distribution path powered by a first independent power source for supplying a portion of a required electrical power to each of the one or more loads partitioned on the first power distribution path, the first independent power source comprising one of an electrical generator and a DC-DC converter; and
  the second power distribution path powered by a second independent power source for supplying a remaining portion of the required electrical power to each of the one or more loads partitioned on the second power distribution path, the second independent power source comprising an electrical energy storage device.

9. The method of claim 8, wherein the supplied portion of the required electrical power comprises half of the required electrical power.

10. The method of claim 1, wherein the predetermined operating mode comprises one of a semi-autonomous operating mode and an autonomous operating mode.

11. Method for opening a connection between first and second power distribution paths arranged in parallel and powered by respective independent power sources for supplying electrical power to a plurality of loads partitioned on each of the first and second power distribution paths, comprising:
  monitoring a respective voltage on each of the first and second power distribution paths;
  comparing each of the monitored voltages to a first voltage range;
  detecting one of a normal condition and an abnormal condition based on the comparing;
  only when a predetermined operating mode requiring fail operational power is enabled, controlling an isolator switch to transition from operating in a closed state to operating in an open state such that a connection between the first and second power distribution paths is opened when the abnormal condition is detected; and
  subsequent to the isolator switch completing the transition to operating in the open state:
    comparing each of the monitored voltages to a second voltage range;
    detecting one of the normal condition and the abnormal condition based on the comparing; and
    controlling the isolator switch to transition from operating in the open state to operating in the closed state only when the normal condition is detected.

12. The method of claim 11, wherein detecting one of the normal condition and the abnormal condition comprises:
  detecting the normal condition when each of the monitored voltages is within the first voltage range; and
  detecting the abnormal condition when at least one of the monitored voltages is not within the first voltage range for a predetermined duration.

13. The method of claim 11, wherein the isolator switch is always operative in the closed state such that the first and second power distribution paths are connected when the predetermined operating mode requiring fail operational power is not enabled.

14. The method of claim 11, further comprising:
  monitoring a state of health (SOH) of one of said respective independent power sources;
  monitoring a SOH the other of said respective independent power sources;
  comparing the monitored SOH of each of the independent power sources to a SOH threshold;
  permitting a predetermined operating mode requiring fail operational power to be enabled only if the monitored SOH of each of the independent power sources is at least the SOH threshold.

15. The method of claim 11, wherein detecting one of the normal condition and the abnormal condition comprises:
  detecting the normal condition when each of the monitored voltages is within the second voltage range, the second voltage range defined by upper and lower limits within the first voltage range; and
  detecting the abnormal condition when at least one of the monitored voltages is not within the second voltage range.

16. An apparatus, comprising:
  a first power distribution path powered by a first independent power source for supplying electrical power to loads partitioned on the first power distribution path;
  a second power distribution path parallel to the first power distribution path and powered by a second independent power source for supplying electrical power to the loads partitioned on the second power distribution path;
  a first electrical center electrically coupled to the first independent power source via the first power distribution path, the first electrical center configured to distribute half of a required load to each of the loads from the first independent power source via the first power distribution path; and
  a second electrical center electrically coupled to the second independent power source via the second power distribution path, the second electrical center configured to distribute half of the required load to each of the loads from the second independent power source via the second power distribution path;
  a first voltage detector configured to monitor a first voltage on the first power distribution path and detect one of a normal condition and an abnormal condition based on the first monitored voltage;
  a second voltage detector configured to monitor a second voltage on the second power distribution path and detect one of the normal condition and the abnormal condition based on the second monitored voltage;
  an isolator switch configured to
    connect the first and second power distribution paths via a connector path when the isolator switch is operative in a closed state when the normal condition is detected by both the first and second voltage detectors, and
    open the connection between the first and second power distribution paths when the isolator switch is operative in an open state when at least one of the first and second voltage detectors detects the abnormal condition; and a plurality of voltage clamp circuits, each voltage clamp circuit connected to respective ones of the first and second power distribution paths and configured to limit a maximum voltage transient on the respective power distribution path to a predetermined magnitude.

17. The apparatus of claim 16, wherein the first independent power source comprises one of an electrical generator and a first DC-DC converter and the second independent power source comprises an electrical energy storage device (ESD) with a second DC-DC converter.

* * * * *